United States Patent [19]

Chaisemartin et al.

[11] Patent Number: 5,101,202

[45] Date of Patent: Mar. 31, 1992

[54] SERIALIZER/DESERIALIZER WITH A TRIANGULAR MATRIX

[75] Inventors: Phillipe Chaisemartin, Brignoud; Alain Artieri, Meylan, both of France

[73] Assignee: SGS-Thomson Microelectronics S.A., Gentilly, France

[21] Appl. No.: 645,875

[22] Filed: Jan. 25, 1991

[30] Foreign Application Priority Data

Jan. 26, 1990 [FR] France .................. 90 01099

[51] Int. Cl.$^5$ ............................................. H03M 9/00
[52] U.S. Cl. .................................. 341/100; 341/101; 357/45; 365/51; 365/219
[58] Field of Search ............. 341/100, 101; 357/45; 365/2, 51, 219, 220, 221

[56] References Cited

U.S. PATENT DOCUMENTS

| | | | |
|---|---|---|---|
| 2,905,928 | 9/1959 | Anderson | 365/51 |
| 3,573,799 | 4/1971 | Drinnan et al. | 341/100 |
| 3,965,462 | 6/1976 | Belt | 365/219 |
| 4,103,347 | 7/1978 | Barton | 365/219 |
| 4,303,992 | 12/1981 | Barkley et al. | 365/51 |
| 4,769,790 | 9/1988 | Yamashito | 365/189 |
| 4,775,990 | 10/1988 | Kamuro et al. | 341/100 |
| 4,901,076 | 2/1990 | Askin et al. | 341/100 |

FOREIGN PATENT DOCUMENTS 0267729  4/1987  European Pat. Off. .
2278114  2/1976  France .

OTHER PUBLICATIONS

Ruoff, IBM Technical Disclosure Bulletin, "Triangular Matrix Array", vol. 3, No. 5, Oct. 1960, p. 48.
Millman, Microelectronics Digital and Analog Circuits and Systems, 1979, McGraw-Hill, pp. 215, 219, 220.

Primary Examiner—Howard L. Williams
Attorney, Agent, or Firm—Lowe, Price, LeBlanc & Becker

[57] ABSTRACT

A serializer/deserializer for a flow of n-bits of data shifted according to the rate of a clock includes an n-rows and n-columns matrix of 1-bit registers (00-77). Each 1-bit register is connected through its input to a first switch connected to the output of the register in the same row and lower rank column and to a second switch connected to the output of the register in the same column and upper rank row. Input terminals (E0-E7) are connected to the registers of the lower rank column and of the upper rank row. Output terminals (S0-S7) are connected to the registers of the upper rank column and of the lower rank row. The matrix cells are arranged according to a triangle, the cells being arranged one with respect to the other according to the structural corresponding to folding a square matrix along its diagonal.

3 Claims, 5 Drawing Sheets

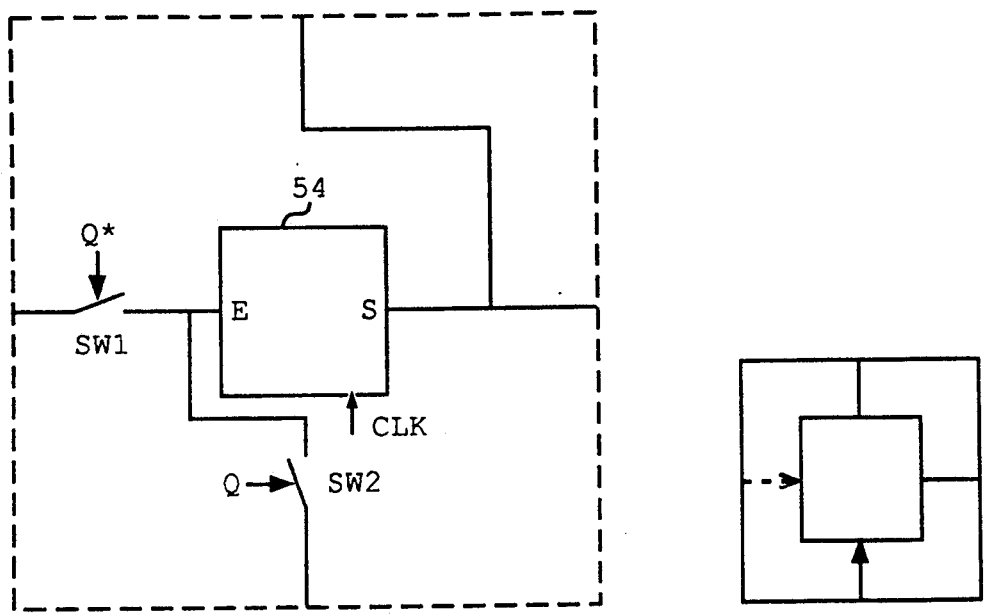
Figure 2
Figure 2A
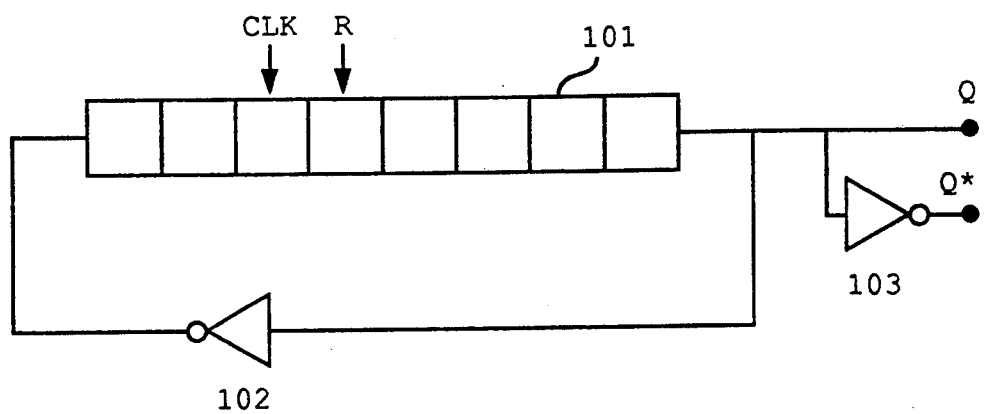
Figure 4

SERIALIZER/DESERIALIZER WITH A TRIANGULAR MATRIX

BACKGROUND OF THE INVENTION

The present invention relates to the field of data processing and more particularly to a device for converting parallel data into serial data, that is, a serializer, or for converting serial data into parallel data, that is, a deserializer.

FIG. 1 schematically and symbolically shows a serializer/deserializer for 8-bit data words. This figure also shows registers arranged according to a matrix, each register being designated by the couple ij of its row number and column number. Thus, the first row comprises registers 00-07; and the last row comprises registers 70-77. In this figure, arrows designate controlled switches. The arrows drawn in solid lines designate switches switched on during a first operation cycle, and the arrows drawn in dashed lines or light grey lines designate switches switched on during a second operation cycle.

The registers of the first column (column 0) and registers of the last row (row 7) are coupled to input terminals E0-E7. The registers of the first row (00-07) and of the last column (07-77) are coupled to output terminals S0-S7.

In FIG. 1, an elementary matrix cell is surrounded by dashed lines around register 54 and this cell is represented in FIGS. 2 and 2A. Register 54 is a one-bit register comprising an input E and an output S and is actuated according to the rate of a clock signal CLK of the circuit. Input E is connected to the left adjacent cell through a first switch SW1 actuated by a singal Q* (complement of signal Q) and to the lower adjacent cell through a second switch SW2 actuated by signal Q. The output S of register 54 is connected to the adjacent cell of the upper row, that is, it is connected to register 44 through associated switch SW2, and to the right-hand cell of the same row, that is, the output is connected to switch SW1 of register 55.

The operation of the circuit of FIG. 1 as a serializer will first be explained. It is assumed that, initially, all registers are empty and that all switches SW1 (arrows drawn in light grey lines) are conductive while all switches SW2 are switched off. Successive data words arrive in parallel at the rate of clock CLK. These words move horizontally from one register to another in the matrix. Thus, after 8 clock pulses, the first word input occupies cells 07-77 of the last column, the second word occupies cells 06-76 of the penultimate column, ... and the eighth word occupies cells 00-70 of the first column.

Then, at the end of eight cycles, the state of switches SW1 and SW2 is reversed, registers continue to be actuated, and data words continue to be input at the rate of clock CLK. The bits contained in each cell will then be vertically shifted. Thus, on outputs S0 to S7 the eight words input in the matix will appear in serial. While the first bits of these words are output from the first row registers (upper row), the next data word on inputs E0-E7 will enter the last row (lower row).

By repeating this operation, that is, by switching the matrix switches every eight clock pulses, serial words are sequentially obtained on outputs S0-S7 while the words arranged in parallel are input at inputs E0-E7, without interrupting the sequence.

It will be noted that the above described serializer operates as a deserializer without any modification, neither in its structure nor in its control mode. In fact, if 8 serial words arrive on inputs E0-E7, These words are converted to parallel on outputs S0-S7.

A drawback of the device illustrated in FIG. 1 comprising a square matrix structure is that significant space is occupied by the existing connections between the inputs and registers of the last row and first column and between the outputs and registers of the first and last column.

In practice, using CMOS technology wherein the minimum length of a transistor gate is 1.2 $\mu$m an 8×8 matrix having an elementary cell such as illustrated in FIG. 2 will occupy a surface of about 0.2 mm$^2$. In this technology, it is not possible to over-miniaturize the dimensions of the connection metallizations, and these connections will occupy a surface of about 0.13 mm$^2$, which is far from negligible as compared with the surface of the active components of the device.

SUMMARY OF THE INVENTION

Thus, an object of the invention is to provide a serializer/deserializer structure with a reduced surface.

Another object of the invention is to provide a serializer/deserializer adapted for processing serial data in the form of successive dibits.

These objects of the invention are achieved by providing a serializer/deserializer for a flow of n-bits data shifted according to the rate of a clock (CLK) having: an n-rows and n-columns matrix of 1-bit registers. Each 1-bit register is connected through its input to a first switch connected to the output of the register in the same row and lower rank column and to a second switch connected to the output of the register in the same column and upper rank row. A control means alternatively switches on the first and second switches every n clock pulses.

Input terminals are connected to the registers of the lower rank column and of the upper rank row, and output terminals are connected to the registers of the upper rank column and of the lower rank row. The matrix cells are arranged according to a triangle, the cells being arranged one with respect to the other according to the structure corresponding to folding a square matrix along its diagonal.

According to one embodiment of the invention, the control means comprise an n-cells register, self-fed back through an inverter and actuated according to the rate of a clock.

According to another embodiment of the invention, the serializer/deserializer is adapted to 2n-bit data flows, wherein serial data are in the form of dibits, and comprises two matrices. The cells of each matrix are geometrically arranged according to a triangle, and the two folded structures are imbedded. Two inputs of the same bit rank of the two matrices are associated with two bits of successive ranks of a parallel data flow or to a dibit of a serial dibit flow.

BRIEF DESCRIPTION OF THE DRAWINGS

The foregoing and other objects, features and advantages of the invention will be apparent from the following detailed description of preferred embodiments as illustrated in the accompanying figures wherein:

FIGS. 2 and 2A show an example of a serializer/deserializer cell;

FIG. 4 shows means for supplying control signals to a serializer/deserializer according to the present invention;

A first aspect of the invention is the specific arrangement of the various cells of a serializer/deserializer matrix designed to reduce the overall surface of the circuit.

Figure 3:
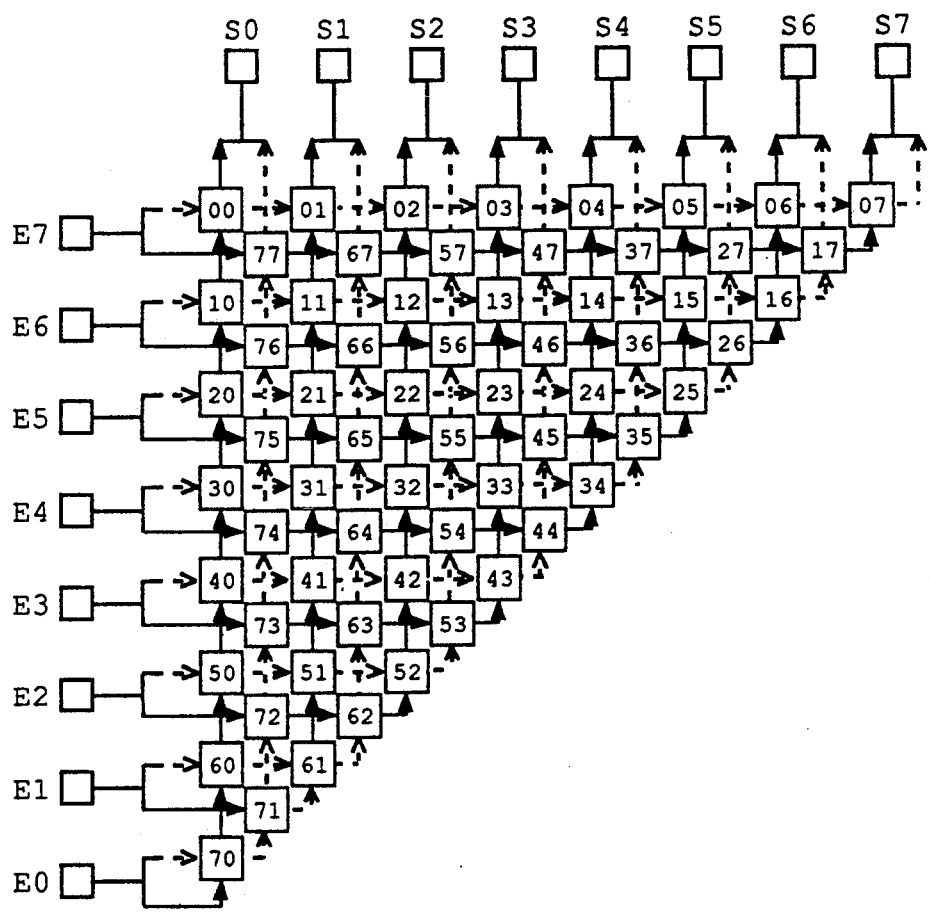
FIG. 3 shows an example of a folded serializer/deserializer structure according to the present invention.

To achieve this size reduction, instead of arranging the components according to a conventional square matrix, the matrix is diagonally folded in the way illustrated in FIG. 3. FIG. 3 is represented with the same symbols used in FIG. 1 and will be easily understood by keeping in mind that during a given operation cycle, only the switches designated by solid arrows or only the switches designated by arrows drawn in dashed lines are conductive.

Figure 1:
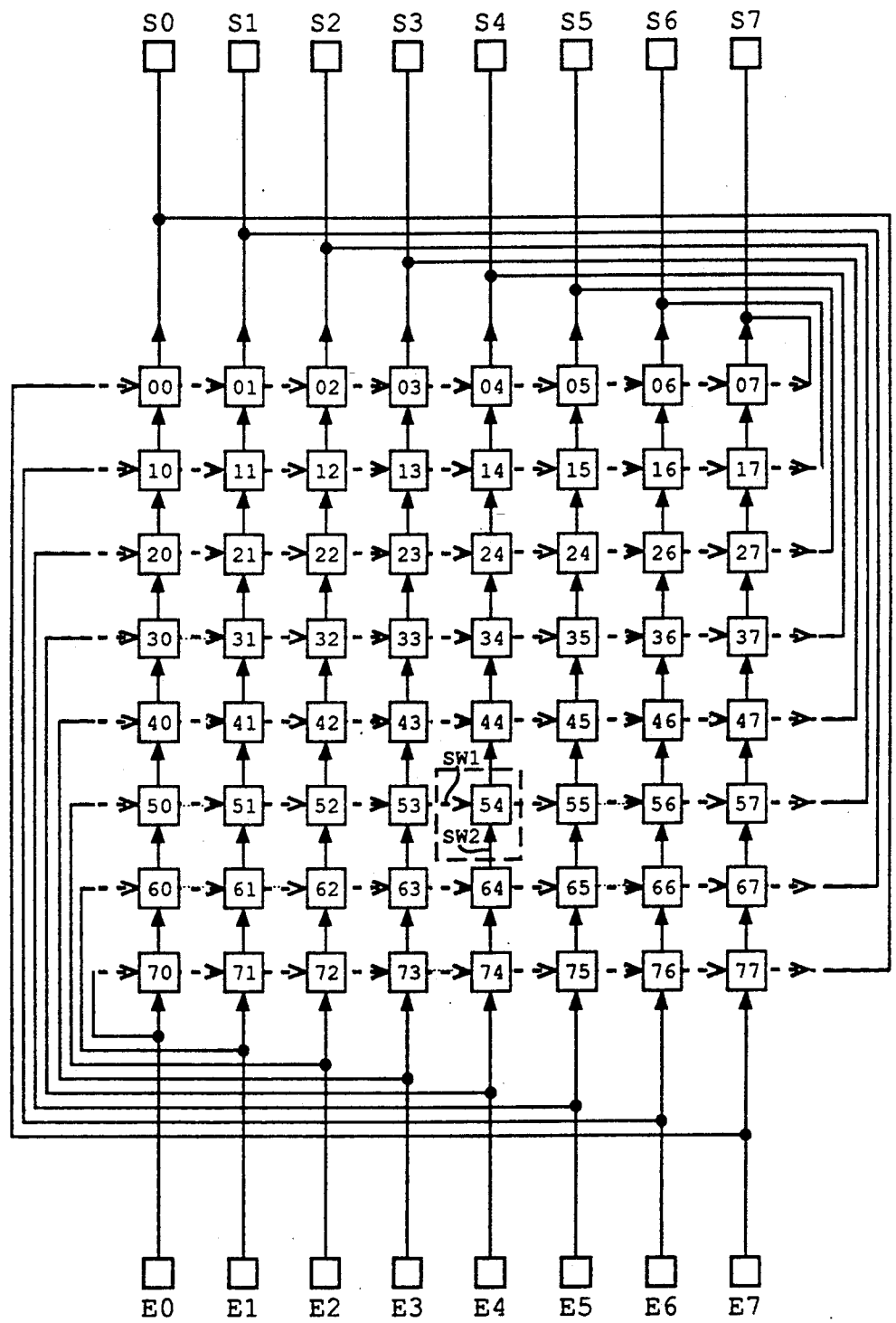
FIG. 1 shows a serializer/deserializer.

It is clear that the device of FIG. 3 exhibits an arrangement change as compared with the device of FIG. 1, but it fulfils exactly the same operation. To ascertain this, it is possible for example, to follow the path of a bit arriving on input E4. During the first operation cycle, this bit will successively pass through registers 30, 31, 32, 33, 34, 35, 36 and 37 to arrive on output S4 (in fact, it will not arrive on output S4 since at the time when it should have arrived thereto, a change in the operation mode will occur). During the next cycle, the successive bits arriving on input E4 will follow the path of registers 74, 64, 54, 44, 34, 24, 14 and 04 towards output S4 (same remark).

With this arrangement, inputs are on one column and outputs on one row. Each input terminal is connected to two adjacent rows, and each output terminal is connected to two adjacent columns. Therefore, the whole surface occupied by the connections shown in FIG. 1 is saved.

The triangular structure according to the invention may seem surprising because, when blocks are placed in an integrated circuit, each one is more or less inscribed within a rectangle and the unused portion of a triangular block is liable to be lost. However, in practical implementations, a single integrated circuit will generally have to include both a serializer and a deserializer simultaneously operating. Then it will be possible to reversely place in a rectangle (or a square) two triangular serializers/deserializers. This provides a significant reduction in overall space requirements.

The invention further provides various modifications in the circuit.

For example, FIG. 4 shows simple means, compatible with the technology of the device according to the invention, for obtaining signals Q and Q* from clock signals CLK. An 8-cell register 101 (as many cells as rows or columns in the matrix of FIG. 1) is actuated according to the circuit clock rate CLK and comprises a reset input R. The register output is back-coupled to its input through an inverter 102. The register output also corresponds to the above signal Q. An inverter 103 supplies signal Q*. During the initialization phase of the system, upon the arrival of the first serial word or of the first parallel word, register 101 is reset. After 8 clock pulses, it will contain only 1s, and outputs Q and Q* will change their state during these 8 clock pulses. The outputs will change state again during the next 8 clock pulses, and so forth.

A second aspect of the invention is the provision of a serializer/deserializer wherein serial data are in the form of dibits, that is, the pairs of successive bits of a serial data word are grouped during the same clock period.

In order to achieve a serializer/deserializer of this type, two identical matrices actuated in the above described way are used. In the case of a serializer, the even bits of a parallel word are loaded into the first matrix 201 and the odd bits are loaded into the second matrix 202. In the case of a deserializer, the first and second bits of each dibit of a serial word are respectively loaded into each matrix.

Figure 5A:
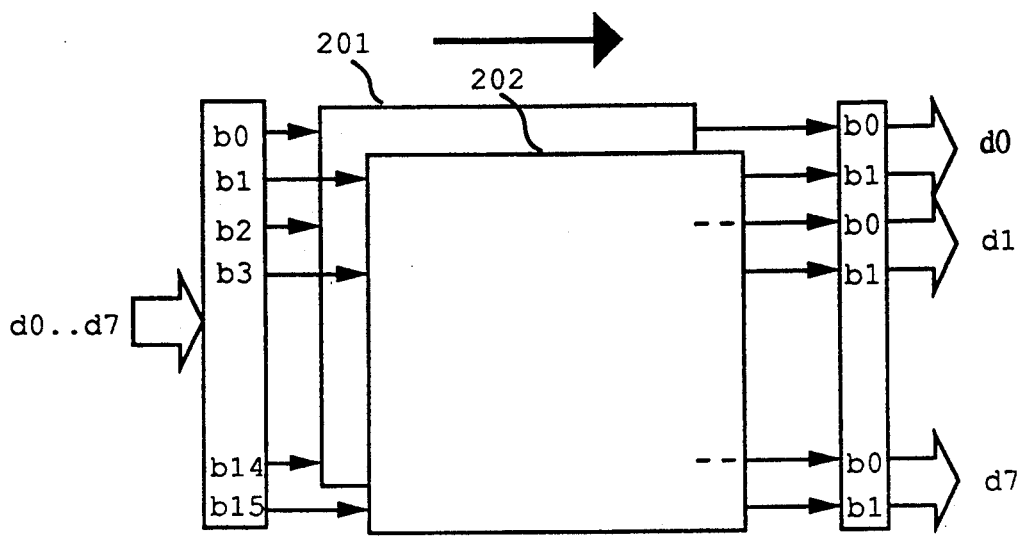
FIGS. 5A and 5B show the operation of a serializer/deserializer wherein serial data are arranged in the form of dibits.
Figure 5B:
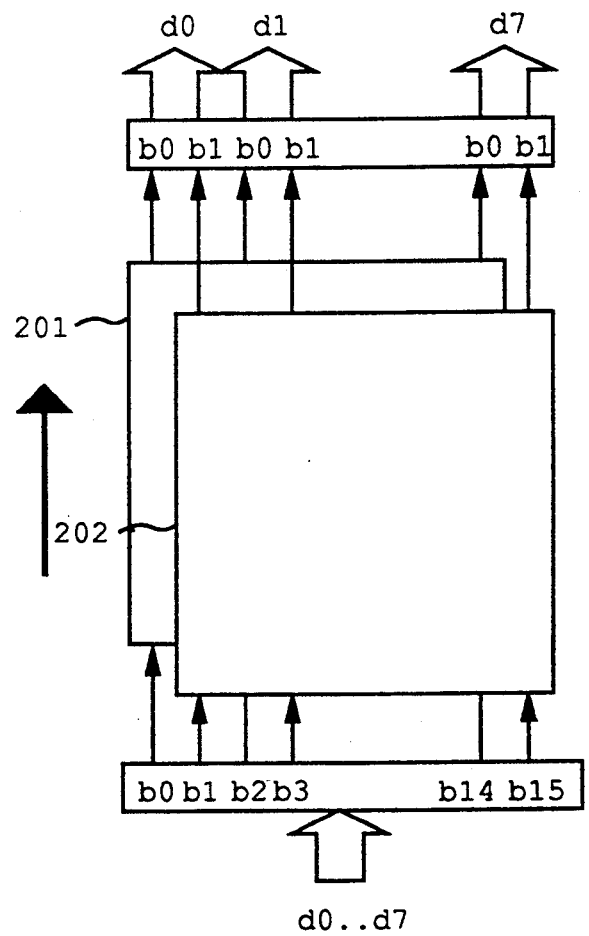

This circuit and its operation are symbolically shown in FIGS. 5A and 5B. FIG. 5A corresponds to a first operation cycle wherein a horizontal shifting is achieved and FIG. 5B corresponding to a second operation cycle wherein a vertical shifting is achieved. These two operation cycles are alternated, as above described. These figures represent the circuit operating as a serializer, but it is clear from the above explanations that the same structure and the same control mode form a deserializer out of this device if data in the form of serial dibits are input.

FIG. 5 shows the device operating in its first cycle (horizontal shifting) and when matrices have already been filled during a previous operation cycle.

The successive data d0–d7 each comprise 16 bits b0–b15 in parallel and are applied to the output circuit, so that bits of even rand b0, b2, . . . b14 are applied to the registers of the first column of the first matrix 201, while the bits of odd rank b1, b3 . . . b15 are applied to the registers of the first column of the second matrix 202. It appears that each matrix has an n ×n dimension if the input data comprise 2n bits in parallel. In the given example, 2n = 16 and n = 8.

During the first clock pulse of the cycle, bits b0–b15 of the first word d0 are loaded into the left column of the matrices, while at the output column, the first two bits b0 and b1 of each word loaded during the previous cycle (vertical shifting) are simultaneously extracted from each matrix 201 and 202 in order to form the first dibits of data words d0–d7 which were loaded during the cycle preceding the one described.

During the second operation cycle, illustrated in FIG. 5B, the operation is the same except that the inputs are applied to the lower row and the outputs are taken from the upper row.

Figure 6:
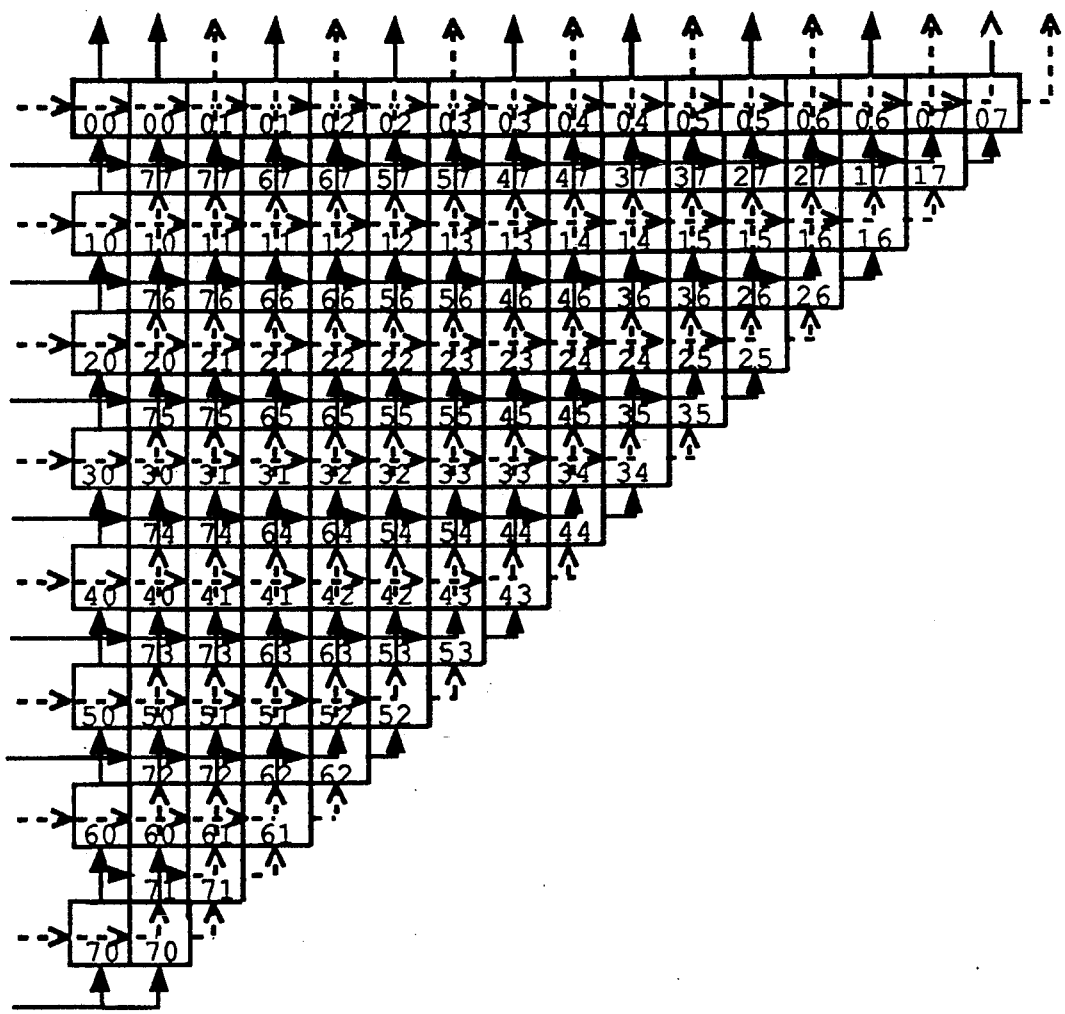
FIG. 6 shows an example of a structure comprising a pair of serializer/deserializer matrices, folded and imbedded according to the present invention.

FIG. 6 shows an arrangement wherein the first and second aspects of the invention are combined. The serial data are in the form of dibits, and two embedded matrices such as the one of FIG. 3 are used. In this representation, the arrows crossing a square illustrating a register indicate that there is a switch between the two registers arranged on both sides of the register in which an arrow is drawn.

Various modifications of the circuit will be apparent to those skilled in the art. For example, in FIG. 1, the bottom-most register and the upper-most register are represented with two input switches and two output switches. In fact, these registers will always be connected since either switch is always conductive and these switches can be suppressed.

On the other hand, the implementations of a one-bit register and of a switch SW1 or SW2 are well known to those skilled in the art and will not be described in detail here. However, it will be noted that in CMOS technology, switches SW1 and SW2 are preferably realized in the form of transfer gates constituted by two MOS transistors of opposite type, that is with an N-channel and P-channel, respectively, one of which is controlled by signal Q and the other by signal Q*. The difference between switches SW1 and SW2 will lie in the fact that in one switch the N-channel transistor will receive signal Q, while in the other the P-channel transistor will receive this signal, so that the operation of switches SW1 and SW2 is opposite when signals Q and Q* change their state.

We claim:

1. A serializer/deserializer for a flow of n-bits of data shifted according to the rate of a clock, comprising:
    an n-rows and n-columns matrix of 1-bit registers, each of which is connected through its input to a first switch connected to the output of the register in the same row and lower rank column and to a second switch connected to the output of the register in the same column and upper rank row,
    control means for alternatively switching on the first and second switches every n-clock pulses,
    input terminals connected to the registers of the lower rank column and of the upper rank row, and
    output terminals connected to the registers of the upper rank column and of the lower rank row, wherein the matrix cells are arranged according to a triangle, the cells being arranged one with respect to the other according to the structure corresponding to folding a square matrix along its diagonal.

2. A serializer/deserializer according to claim 1, wherein the control means comprise an n-cells register self fed back through an inverter and actuated according to the rate of a clock.

3. A serializer/deserializer according to claim 1, adapted to 2n-bits of data flows, wherein the serial data are in the form of dibits, and comprising two matrices, the cells of each matrix being geometrically arranged according to a triangle, and the two folded structures being imbedded, two inputs of a same bit rank of the two matrices being associated to two bits of successive rank of a parallel data flow or to a dibit of a serial dibit flow.

* * * * *